(12) United States Patent
Nabatame et al.

(10) Patent No.: US 8,207,584 B2
(45) Date of Patent: Jun. 26, 2012

(54) SEMICONDUCTOR DEVICE AND MANUFACTURING METHOD OF THE SAME

(75) Inventors: Toshihide Nabatame, Tokyo (JP); Kunihiko Iwamoto, Kyoto (JP); Yuuichi Kamimuta, Yokohama (JP)

(73) Assignees: Renesas Electronics Corporation, Kawasaki-shi (JP); Rohm Co., Ltd., Kyoto-shi (JP)

( * ) Notice: Subject to any disclaimer, the term of this patent is extended or adjusted under 35 U.S.C. 154(b) by 269 days.

(21) Appl. No.: 12/329,580

(22) Filed: Dec. 6, 2008

(65) Prior Publication Data
US 2009/0146216 A1 Jun. 11, 2009

(30) Foreign Application Priority Data
Dec. 7, 2007 (JP) ................................. 2007-316545

(51) Int. Cl.
*H01L 21/02* (2006.01)

(52) U.S. Cl. . 257/406; 257/369; 257/411; 257/E21.625; 257/E21.639; 257/E27.062

(58) Field of Classification Search .................. 257/369, 257/411, 405, 406, 410, E27.062, E21.19, 257/E21.625, E21.639; 438/216, 287, 587, 438/588, 591, FOR. 177
See application file for complete search history.

(56) References Cited

U.S. PATENT DOCUMENTS

| | | | |
|---|---|---|---|
| 6,407,435 B1 * | 6/2002 | Ma et al. | 257/411 |
| 6,833,596 B2 | 12/2004 | Matsuo | |
| 2002/0153579 A1 * | 10/2002 | Yamamoto | 257/412 |
| 2004/0084734 A1 * | 5/2004 | Matsuo | 257/407 |
| 2005/0064653 A1 * | 3/2005 | Park et al. | 438/232 |
| 2007/0210354 A1 * | 9/2007 | Nabatame et al. | 257/288 |
| 2008/0283929 A1 * | 11/2008 | Nabatame | 257/369 |
| 2009/0008725 A1 * | 1/2009 | Guha et al. | 257/411 |
| 2009/0114996 A1 * | 5/2009 | Inumiya et al. | 257/369 |
| 2011/0204450 A1 * | 8/2011 | Moriya | 257/369 |

FOREIGN PATENT DOCUMENTS

JP 2003-282875 A 10/2003

* cited by examiner

*Primary Examiner* — Julio J Maldonado
*Assistant Examiner* — Quovaunda V Jefferson
(74) *Attorney, Agent, or Firm* — Miles & Stockbridge P.C.

(57) ABSTRACT

After forming a pure silicon oxide film on respective surfaces of an n-type well and a p-type well, an oxygen deficiency adjustment layer made of an oxide of 2A group elements, an oxide of 3A group elements, an oxide of 3B group elements, an oxide of 4A group elements, an oxide of 5A group elements or the like, a high dielectric constant film, and a conductive film having a reduction catalyst effect to hydrogen are sequentially deposited on the silicon oxide film, and the substrate is heat treated in the atmosphere containing $H_2$, thereby forming a dipole between the oxygen deficiency adjustment layer and the silicon oxide film. Then, the conductive film, the high dielectric constant film, the oxygen deficiency adjustment layer, the silicon oxide film and the like are patterned, thereby forming a gate electrode and a gate insulating film.

8 Claims, 13 Drawing Sheets

SEMICONDUCTOR DEVICE AND MANUFACTURING METHOD OF THE SAME

CROSS-REFERENCE TO RELATED APPLICATION

The present application claims priority from Japanese Patent Application No. JP 2007-316545 filed on Dec. 7, 2007, the content of which is hereby incorporated by reference into this application.

TECHNICAL FIELD OF THE INVENTION

The present invention relates to a semiconductor device and a manufacturing method of the same, and more particularly to a technology effectively applied to a semiconductor device provided with a complementary MISFET (Metal Insulator Semiconductor Field Effect Transistor) and a manufacturing method of the same.

BACKGROUND OF THE INVENTION

Japanese Patent Application Laid-Open Publication No. 2003-282875 (Patent Document 1) discloses a complementary MISFET that uses an aluminum oxide ($Al_2O_3$) film as its gate insulating film and a manufacturing process thereof.

SUMMARY OF THE INVENTION

In recent years, with the increasing demands for high integration of semiconductor devices including the MISFET, it is required to minutely process a semiconductor device. Since the characteristics of the MISFET are influenced by the electrostatic capacitance of its gate insulating film, in order to have the same characteristics even when the MISFET is minutely processed, it is required to process the MISFET so that the electrostatic capacitance of the gate insulating film is not changed. Since the area of the gate insulating film becomes small with the microfabrication, in order to maintain the electrostatic capacitance thereof, the method of reducing the film thickness of the gate insulating film is employed.

Here, when a silicon oxide film is selected as a gate insulating film, there is a fear of occurrence of the so-called tunnel current, in which electrons flowing in a channel penetrate through a barrier wall formed of the gate insulating film due to the reduction in film thickness and flow into the gate electrode. Therefore, the method has been examined in which a thin film with a larger dielectric constant than that of a silicon oxide film (hereinafter, referred to as a high dielectric constant film) is used as a gate insulating film so as to maintain the electrostatic capacitance of the gate insulating film without reducing the film thickness in comparison with the case of using a silicon oxide film.

Meanwhile, when the complementary MISFET is manufactured by use of such a high dielectric constant film as its gate insulating film, suitable high dielectric constant films and gate electrode materials are respectively selected for a p-channel MISFET and an n-channel MISFET, thereby realizing the threshold voltages required for the respective ones. Therefore, it is difficult to easily realize the threshold voltages required for both the p-channel MISFET and the n-channel MISFET.

An object of the present invention is to provide a complementary MISFET that uses a high dielectric constant film as its gate insulating film and can easily realize the threshold voltages required for both the p-channel MISFET and the n-channel MISFET, and a manufacturing method of the same.

The above and other objects and novel characteristics of the present invention will be apparent from the description of this specification and the accompanying drawings.

The typical ones of the inventions disclosed in this application will be briefly described as follows.

(1) A semiconductor device according to the present invention is a semiconductor device comprising: a MISFET having a first gate insulating film whose dielectric constant is relatively larger than that of silicon oxide and a first gate electrode including a first metal film having a reduction catalyst effect to hydrogen on a main surface of a semiconductor substrate, wherein the first gate insulating film is formed by laminating an silicon oxide layer, an oxygen deficiency adjustment layer, and a high dielectric constant layer whose dielectric constant is relatively larger than that of the silicon oxide layer in this order from below, and the oxygen deficiency adjustment layer is an oxide containing 2A group elements, 3A group elements, 3B group elements, 4A group elements, or 5A group elements.

(2) Also, a manufacturing method of a semiconductor device according to the present invention is a manufacturing method of a semiconductor device having a complementary MISFET, the method comprising the steps of:

(a) forming a silicon oxide layer on a main surface of a semiconductor substrate;

(b) forming an oxygen deficiency adjustment layer on the silicon oxide layer;

(c) removing the oxygen deficiency adjustment layer in a second region on the main surface of the semiconductor substrate, while leaving the oxygen deficiency adjustment layer in a first region on the main surface of the semiconductor substrate;

(d) after the step (c), forming a high dielectric constant layer whose dielectric constant is relatively larger than that of the silicon oxide layer on the main surface of the semiconductor substrate;

(e) forming a first metal film having a reduction catalyst effect to hydrogen on the high dielectric constant layer in the first region;

(f) forming a second metal film on the high dielectric constant layer in the second region;

(g) after the step (e), performing a heat treatment to the semiconductor substrate;

(h) forming a compound film of silicon and a metal on the first metal film in the first region and on the second metal film in the second region; and (i) patterning the compound film, the first metal film, the high dielectric constant layer, the oxygen deficiency adjustment layer and the silicon oxide layer, thereby forming a first gate electrode and a first gate insulating film of a p-channel MISFET in the first region, and patterning the compound film, the second metal film, the high dielectric constant layer, and the silicon oxide layer, thereby forming a second gate electrode and a second gate insulating film of an n-channel MISFET in the second region, wherein the oxygen deficiency adjustment layer is an oxide containing 2A group elements, 3A group elements, 3B group elements, 4A group elements, or 5A group elements.

Further, a manufacturing method of a semiconductor device according to the present invention is a manufacturing method of a semiconductor device having a complementary MISFET, the method comprising the steps of:

(a) forming a silicon oxide layer on a main surface of a semiconductor substrate;

(b) forming an oxygen deficiency adjustment layer on the silicon oxide layer;

(c) after the step (b), forming a high dielectric constant layer whose dielectric constant is relatively larger than that of the silicon oxide layer on the main surface of the semiconductor substrate;

(d) forming a first metal film having a reduction catalyst effect to hydrogen on the high dielectric constant layer in the first region and the second region on the main surface of the semiconductor substrate;

(e) after the step (d), forming a second metal film on the first metal film in the second region;

(f) after the step (e), performing a heat treatment to the semiconductor substrate;

(g) forming a compound film of silicon and a metal on the first metal film in the first region and on the second metal film in the second region; and (h) patterning the compound film, the second metal film, the first metal film, the high dielectric constant layer and the silicon oxide layer, thereby forming a first gate electrode and a first gate insulating film of an n-channel MISFET in the second region, and patterning the compound film, the first metal film, the high dielectric constant layer, the oxygen deficiency adjustment layer and the silicon oxide layer, thereby forming a second gate electrode and a second gate insulating film of a p-channel MISFET in the first region, wherein the oxygen deficiency adjustment layer is an oxide containing 2A group elements, 3A group elements, 3B group elements, 4A group elements, or 5A group elements.

The effects obtained by typical aspects of the present invention will be briefly described below.

It is possible to easily control the threshold voltage of a complementary MISFET using a high dielectric constant film as its gate insulating film.

BRIEF DESCRIPTIONS OF THE DRAWINGS

DESCRIPTIONS OF THE PREFERRED EMBODIMENTS

Figure 1:
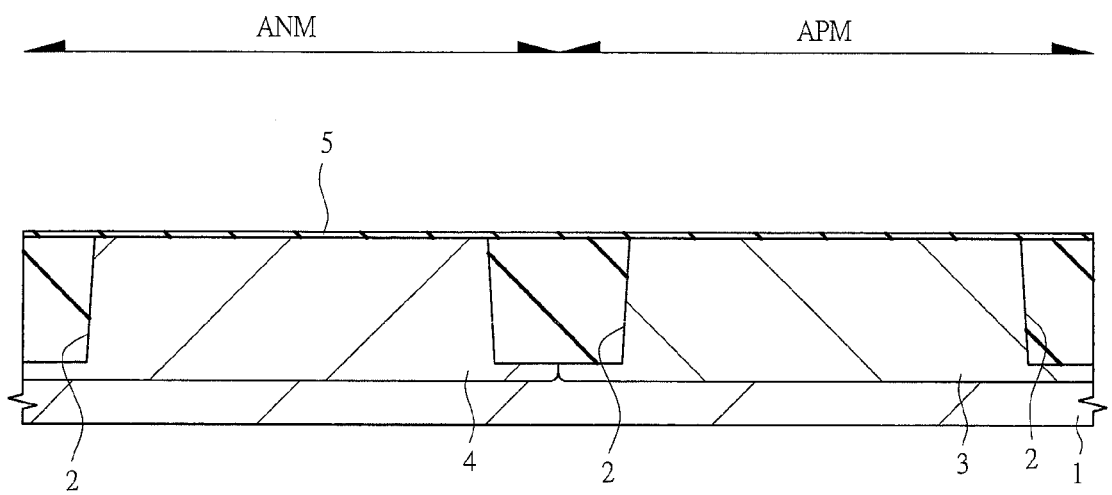
FIG. 1 is a cross sectional view showing the principal part for describing a manufacturing method of a semiconductor device according to a first embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Also, even when mentioning that constituent elements or the like are "made of A" or "comprise A" in the embodiments below, elements other than A are not excluded except the case where it is particularly specified that A is the only element.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Further, when referring to the material or the like, the specified material is a main material thereof unless otherwise stated or except the case where it is not so in principle and in situation, and other subsidiary element, additives, additional elements and others are not excluded. For example, a silicon member contains not only pure silicon but also additive impurities and binary and ternary alloys mainly made of silicon (for example, SiGe) unless otherwise stated.

Also, components having the same function are denoted by the same reference symbols throughout the drawings for describing the embodiments, and the repetitive description thereof is omitted.

Also, in the drawings used in the embodiments, hatching is used in some cases even in a plan view so as to make the drawings easy to see.

Hereinafter, embodiments of the present invention will be described with reference to the drawings.

First Embodiment

A semiconductor device according to a first embodiment is, for example, a semiconductor device having a complementary MISFET. Such a semiconductor device according to the first embodiment and a manufacturing method of the same will be described with reference to FIG. 1 to FIG. 17.

First, as shown in FIG. 1, a semiconductor substrate made of, for example, p-type single crystal silicon (hereinafter, simply referred to as a substrate) 1 is prepared. In the cross section of the substrate 1 shown in FIG. 1, a region in which an n-channel MISFET is formed (second region) ANM and a region in which a p-channel MISFET is formed (first region) APM are shown.

Subsequently, element isolation trenches 2 are formed in the element isolation region of the main surface of the substrate 1. The element isolation trenches 2 are formed by, for example, forming trenches in the main surface of the substrate 1 by dry etching, depositing an insulating film such as a silicon oxide film on the substrate 1 including the insides of the trenches by the CVD method, and then polishing and removing the unnecessary silicon oxide film outside the trenches by the chemical mechanical polishing (CMP) method to leave the silicon oxide film inside the trenches.

Then, an n-type impurity (for example, P (phosphorous)) is ion implanted into the main surface of the substrate 1 in the region APM, and a p-type impurity (for example, B (boron)) is ion implanted into the main surface of the substrate 1 in the region ANM. Subsequently, the substrate 1 is subjected to a heat treatment so that these impurities are diffused in the substrate 1, thereby forming an n-type well 3 in the main surface of the substrate 1 in the region APM and a p-type well 4 in the main surface of the substrate 1 in the region ANM.

Then, the main surface of the substrate 1 (the n-type well 3 and the p-type well 4) is wet cleaned by use of hydrofluoric-acid-based cleaning solution, and thereafter, a pure silicon oxide film 5 is formed on the respective surfaces of the n-type well 3 and the p-type well 4 by thermal oxidation.

Figure 2:
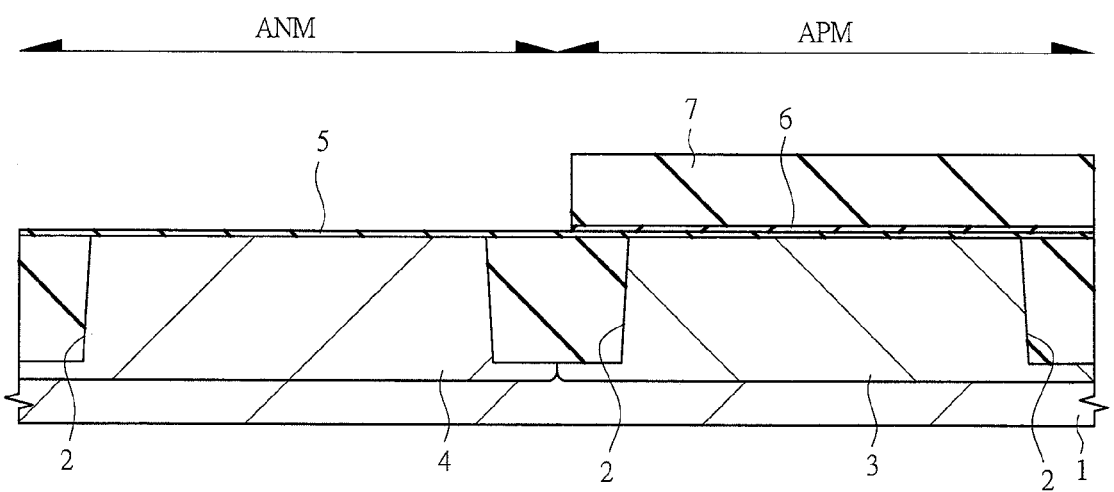
FIG. 2 is a cross sectional view showing the principal part of the manufacturing process of the semiconductor device continued from FIG. 1.

Next, as shown in FIG. 2, by use of the ALD (Atomic Layer Deposition) method, an $Al_2O_3$ film with the film thickness of approximately 0.5 nm is formed on the main surface of the substrate 1 to form an oxygen deficiency adjustment layer 6. As this oxygen deficiency adjustment layer 6, a single layer film, a lamination film, or an alloy film of oxides of 2A group elements (for example, MgO, CaO, SrO and BaO), oxides of 3A group elements (for example, $Y_2O_3$ and $La_2O_3$), oxides of 3B group elements, oxides of 4A group elements (for example, $HfO_2$), oxides of 5A group elements and the like may be employed besides the $Al_2O_3$ film. The oxygen deficiency adjustment layer 6 is left only in the region APM in the later process, and the material of the oxygen deficiency adjustment layer 6 can be appropriately selected in accordance with the characteristics of the p-channel MISFET to be manufactured.

Then, the oxygen deficiency adjustment layer 6 other than that on the n-type well 3 (region APM) is etched and removed with using a photoresist film 7 patterned by photolithography technique as a mask.

Figure 3:
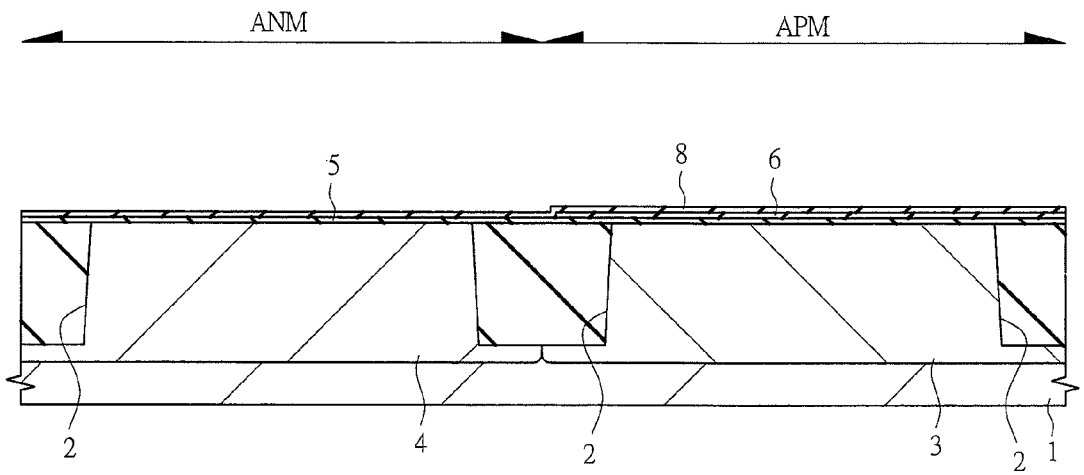
FIG. 3 is a cross sectional view showing the principal part of the manufacturing process of the semiconductor device continued from FIG. 2.

Next, as shown in FIG. 3, an $HfO_2$ film is formed on the main surface of the substrate 1 by, for example, the ALD method, and a high dielectric constant film (high dielectric constant layer) 8 to be the gate insulating film of the complementary MISFET is formed. Then, a PDA (Post Deposition Anneal) process at, for example, approximately 850° C. is performed to the substrate 1.

Figure 4:
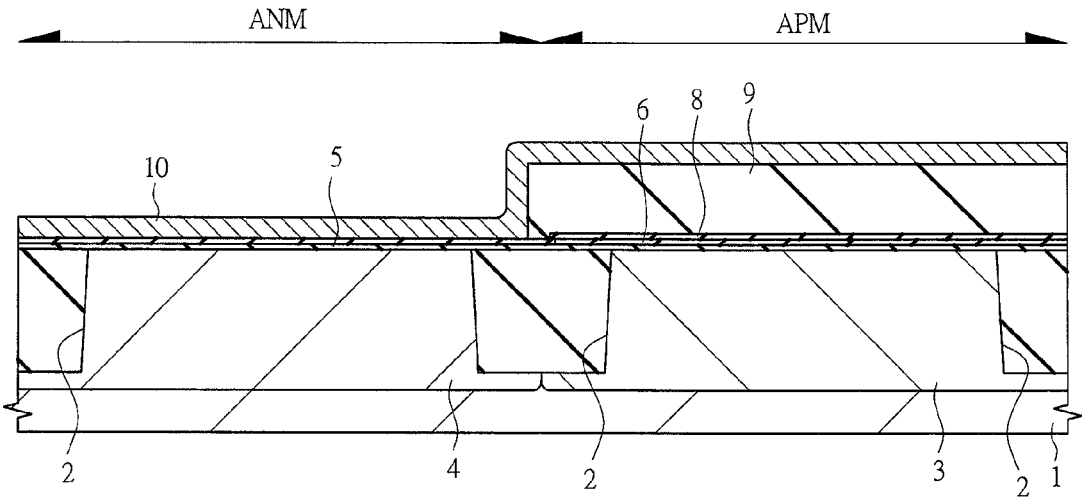
FIG. 4 is a cross sectional view showing the principal part of the manufacturing process of the semiconductor device continued from FIG. 3.

Next, as shown in FIG. 4, after covering the regions other than the region ANM with the photoresist film 9 patterned by the photolithography technique, a tantalum nitride film (second metal film) 10 with the film thickness of, for example, approximately 20 nm is deposited on the main surface of the substrate 1. Although illustration thereof is omitted, the tantalum nitride film 10 of the regions other than the region ANM can be removed by removing the photoresist film 9 thereafter (so-called lift-off method).

Figure 5:
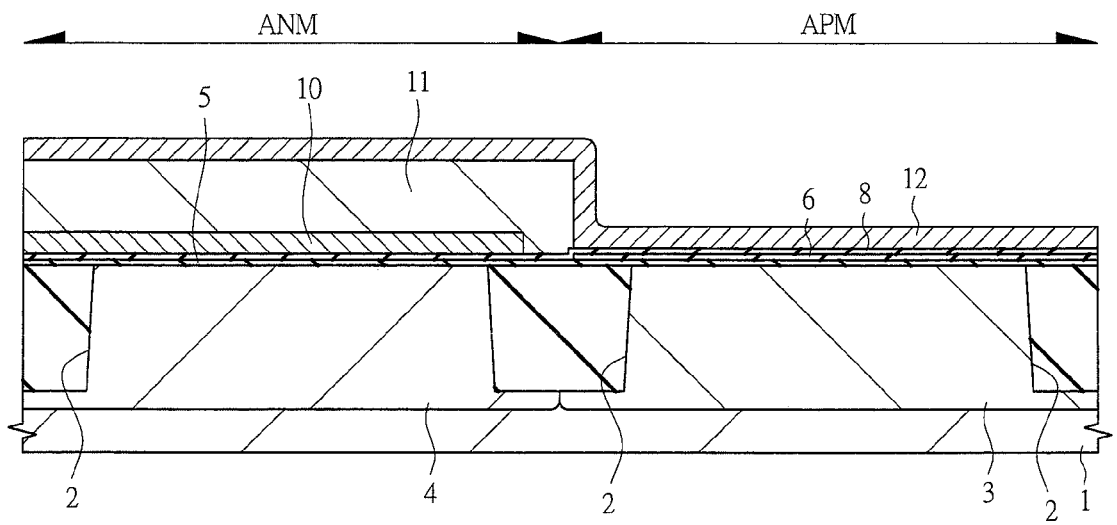
FIG. 5 is a cross sectional view showing the principal part of the manufacturing process of the semiconductor device continued from FIG. 4.

Next, after removing the tantalum nitride film 10 of the regions other than the region ANM by removing the photoresist film 9, as shown in FIG. 5, the regions other than the region ANM are covered with a photoresist film 11 patterned by the photolithography technique, and then, a Pt (platinum) film with the film thickness of, for example, approximately 20 nm is formed on the main surface of the substrate 1 as a conductive film having an reduction catalyst effect to hydrogen (first metal film) 12. In the first embodiment, although a Pt film is used as an example of the conductive film 12 that has the reduction catalyst effect to hydrogen, it is also preferable to use a Re (rhenium) film or a lamination film of a Pt film and a Re film.

Figure 6:
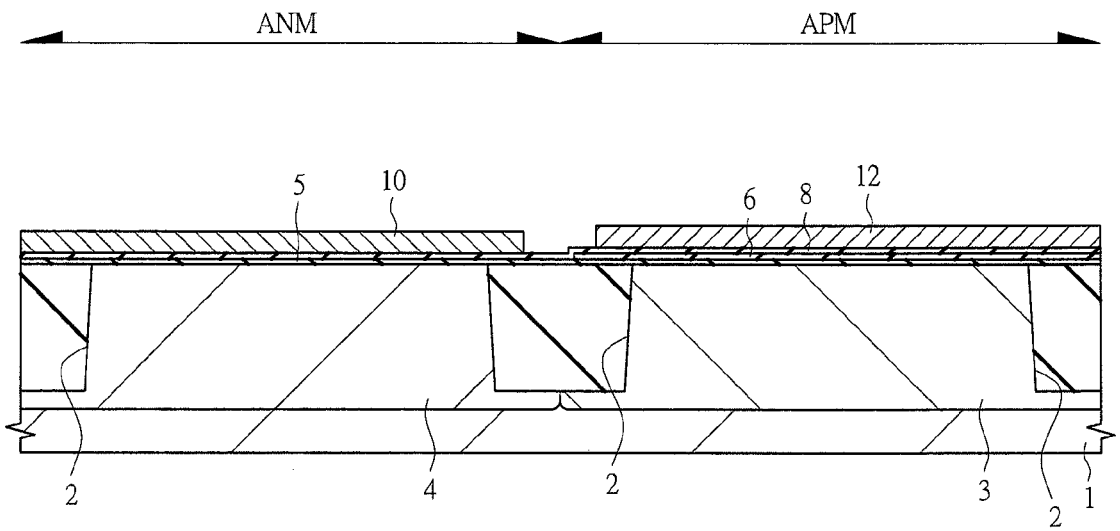
FIG. 6 is a cross sectional view showing the principal part of the manufacturing process of the semiconductor device continued from FIG. 5.

Next, as shown in FIG. 6, the conductive film 12 of the regions other than the region APM is removed by removing the photoresist film 11 by the liftoff method.

Then, the substrate 1 is heat treated at approximately 450° C. in the atmosphere containing approximately 3% of $H_2$ (hydrogen). By this means, it is possible to control the effective work function of the p-channel MISFET to be completed at a later process. This principle will be described in detail below.

Figure 7:
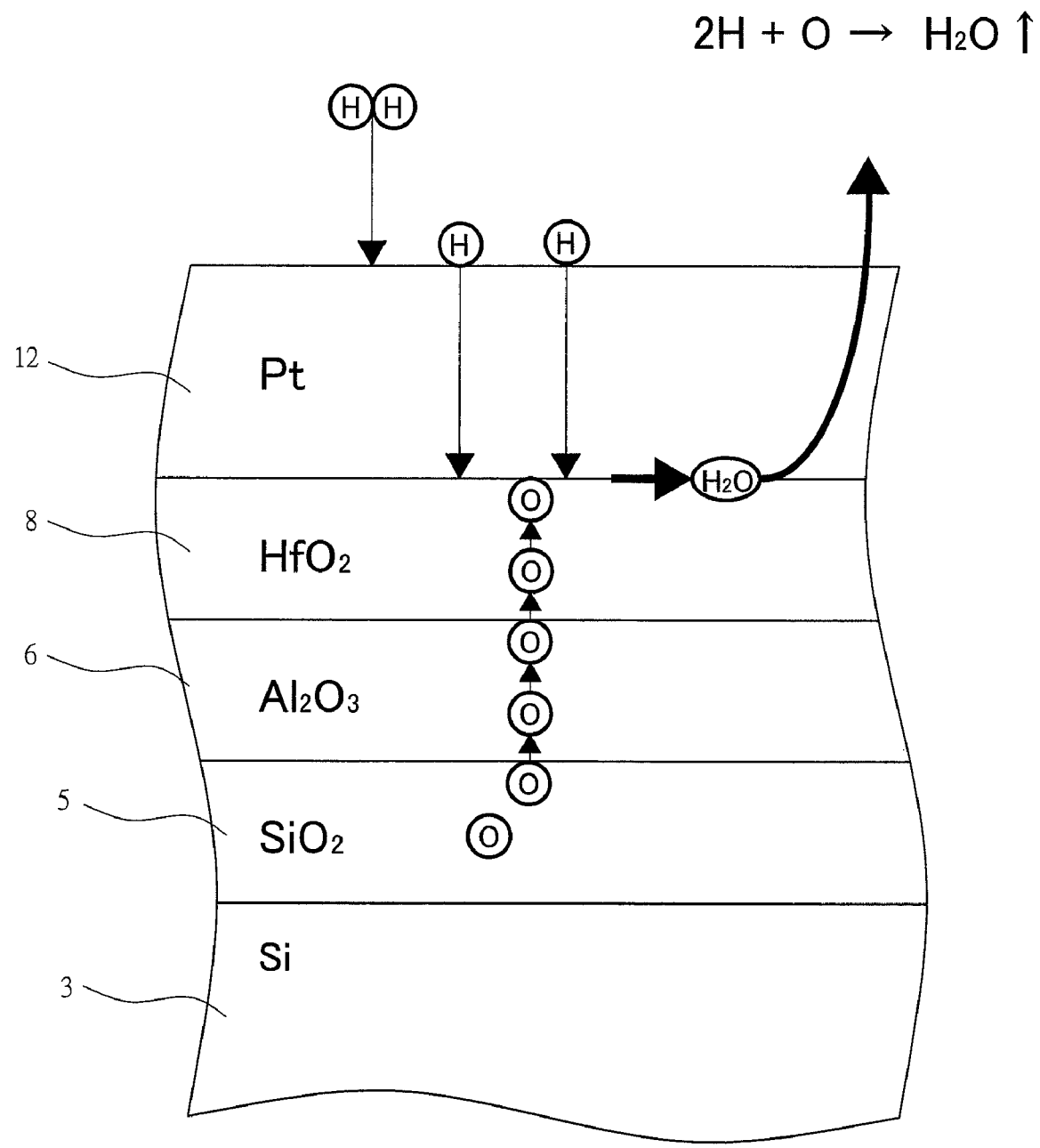
FIG. 7 is an explanatory diagram of the reduction catalyst effect to hydrogen in the manufacturing process of the semiconductor device according to the first embodiment of the present invention.

As mentioned above, the conductive film 12 has the reduction catalyst effect to hydrogen, and as shown in FIG. 7, O (oxygen) that composes the high dielectric constant film 8 formed of an HfO$_2$ film is reduced to generate H$_2$O (water) by the heat treatment in the atmosphere containing approximately 3% of H$_2$. Although the high dielectric constant film 8 has a composition in which O is deficient by the reduction, O is taken in from the underlying oxygen deficiency adjustment layer 6 formed of the Al$_2$O$_3$ film, thereby compensating the deficiency of O. Therefore, the oxygen deficiency adjustment layer 6 has a composition in which O is deficient, and a dipole (2e$^-$, Vo$^{2+}$) is formed between the oxygen deficiency adjustment layer 6 and the silicon oxide film 5.

Figure 8:
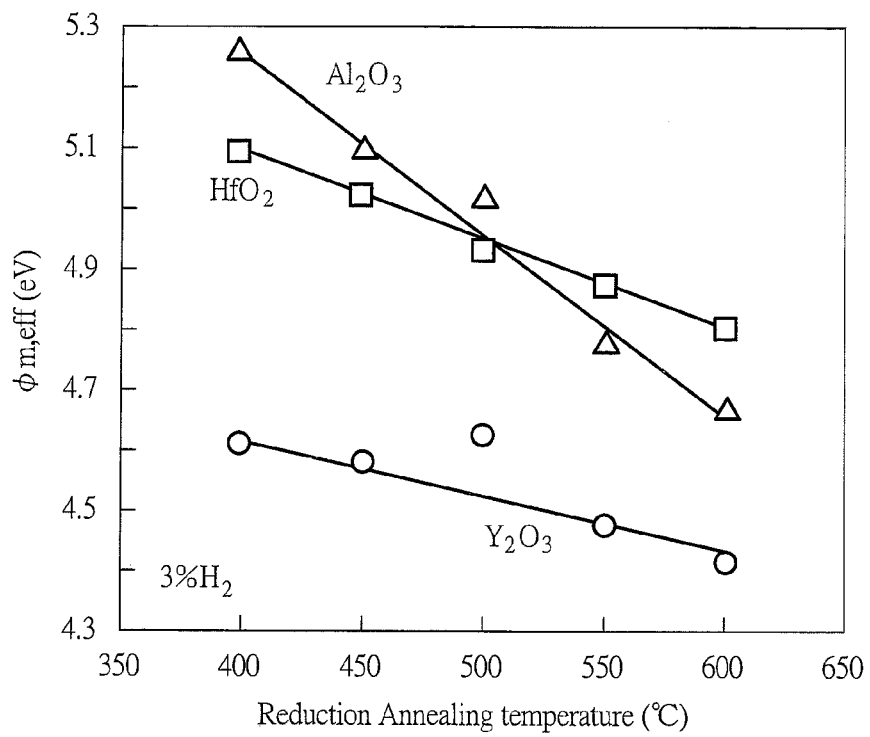
FIG. 8 is an explanatory diagram showing the relation between the temperature in the heat treatment to perform the reduction to hydrogen and the effective work function of the p-channel MISFET.
Figure 9:
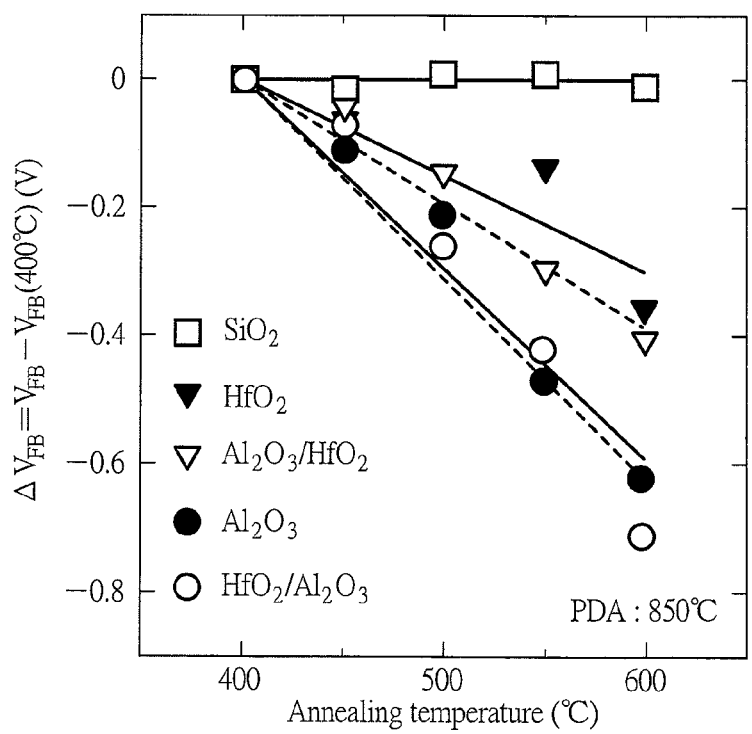
FIG. 9 is an explanatory diagram showing the relation between the temperature in the heat treatment to perform the reduction to hydrogen and the change amount of the flat band voltage of the p-channel type MISFET.
Figure 10:
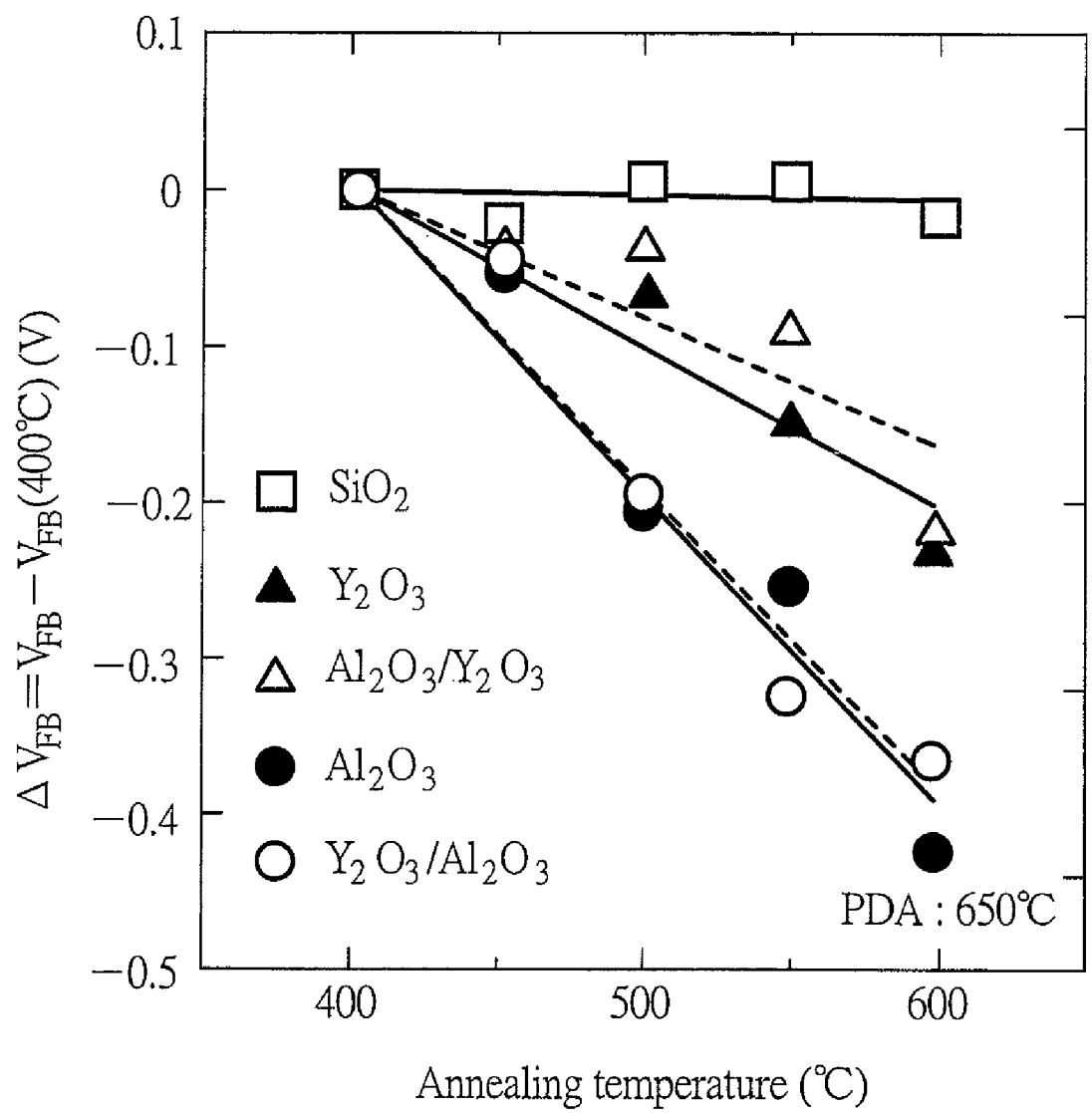
FIG. 10 is an explanatory diagram showing the relation between the temperature in the heat treatment to perform the reduction to hydrogen and the change amount of the flat band voltage of the p-channel type MISFET.
Figure 11:
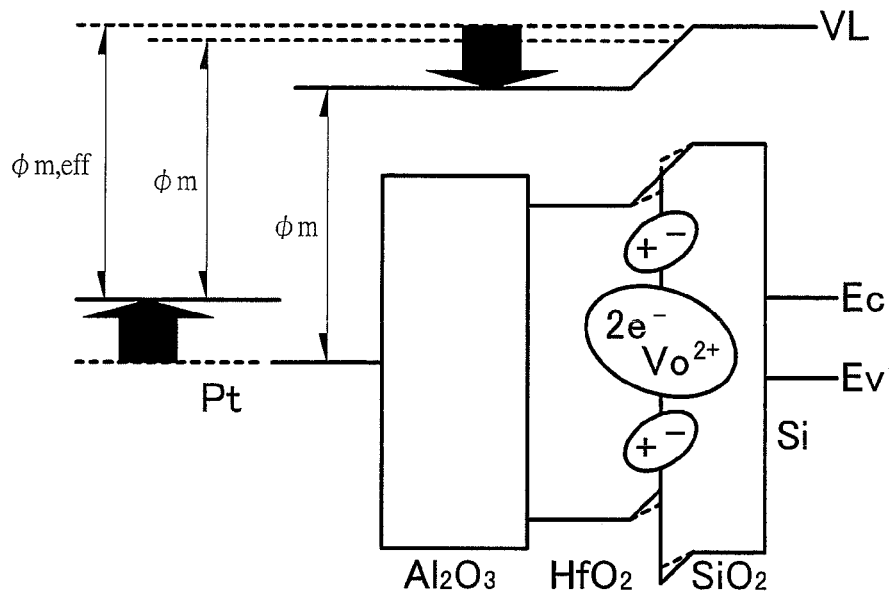
FIG. 11 is an explanatory diagram showing the change of the effective work function of the p-channel MISFET by the heat treatment to perform the reduction to hydrogen.
Figure 12:
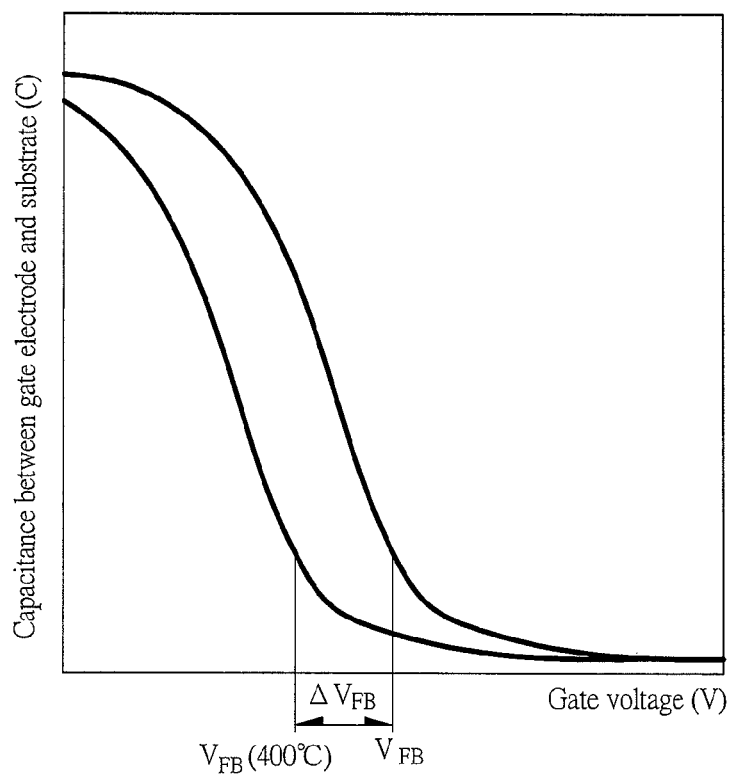
FIG. 12 is an explanatory diagram showing the relation between the gate voltage and the capacitance between the gate electrode and the substrate in the p-channel MISFET of the semiconductor device according to the first embodiment of the present invention.

Herein, FIG. 8 shows the relation between the temperature in the heat treatment in which the above-described reduction to hydrogen is performed and the effective work function φm, eff (eV) of the p-channel MISFET to be completed at a later process, in which the case where Al$_2$O$_3$ described with reference to FIG. 2 is used for the oxygen deficiency adjustment layer 6, the case where HfO$_2$ is used therefor, and the case where Y$_2$O$_3$ is used therefor are shown. In FIG. 8, 400° C. to 600° C. is shown as the range of the actually measured temperature of the heat treatment, and this is because these temperatures are the upper limit and the lower limit at which the reduction catalyst effect to hydrogen of the conductive film 12 can be acquired. Further, FIGS. 9 and 10 show the relation between the temperature in the heat treatment in which the above-described reduction to hydrogen is performed and the change amount (ΔVFB (V)) of the flat band voltage (threshold voltage) V$_{FB}$ (V) of the p-channel MISFET to be completed at a later process (with 400° C. as a reference). In FIG. 9, the case where Al$_2$O$_3$ described with reference to FIG. 2 is used for the oxygen deficiency adjustment layer 6, the case where SiO$_2$ (silicon oxide) is used therefor, the case where HfO$_2$ is used therefor, and the case where the lamination film of Al$_2$O$_3$ and HfO$_2$ is used therefor (two cases where Al$_2$O$_3$ is the upper layer and Al$_2$O$_3$ is the lower layer) are shown. In FIG. 10, the case where Al$_2$O$_3$ described with reference to FIG. 2 is used for the oxygen deficiency adjustment layer 6, the case where SiO$_2$ (silicon oxide) is used therefor, the case where Y$_2$O$_3$ is used therefor, and the case where the lamination film of Al$_2$O$_3$ and Y$_2$O$_3$ is used therefor (two cases where Al$_2$O$_3$ is the upper layer and Al$_2$O$_3$ is the lower layer) are shown. Note that FIG. 9 shows the case where the PDA processing temperature after the formation of the high dielectric constant film 8 (refer to the description with reference to FIG. 2) is 850° C., and FIG. 10 shows the case where the PDA processing temperature after the formation of the high dielectric constant film 8 (refer to the description with reference to FIG. 2) is 650° C. Moreover, in FIG. 11, the change of the work function φm (eV) of the p-channel MISFET by the formation of the dipole (2e$^-$, Vo$^{2+}$) between the oxygen deficiency adjustment layer 6 and the silicon oxide film 5 is shown by use of an energy band, and the effective work function φm, eff (eV) is also shown. Note that VL, Ev, and Ec in FIG. 11 show the vacuum level, the conduction band, and the valence band, respectively. Furthermore, FIG. 12 shows the relation between the gate voltage of the p-channel MISFET by the formation of the dipole (2e$^-$, Vo$^{2+}$) between the oxygen deficiency adjustment layer 6 and the silicon oxide film 5 and the capacitance value between the gate electrode and the substrate 1 (n-type well 3), in which a graph in the case where the dipole (2e$^-$, Vo$^{2+}$) is formed and a graph in the case where the dipole (2e$^-$, Vo$^{2+}$) is not formed are shown.

As shown in FIGS. 8 to 12 mentioned above, by the heat treatment in the atmosphere containing H$_2$ (hydrogen) after the formation of the conductive film 12 having the reduction catalyst effect to hydrogen, the above-described dipole (2e$^-$, Vo$^{2+}$) caused by the oxygen deficiency (Vo) of the oxygen deficiency adjustment layer 6 that is in contact with the silicon oxide film 5 is formed, and the effective work function φm, eff (eV) of the p-channel MISFET falls, and the flat band voltage (threshold voltage) also falls. Moreover, as shown in FIGS. 8 to 10, when the magnitudes of the changes of the flat band voltage (threshold voltage) of the p-channel MISFET to the changes of the temperature of the heat treatment in the atmosphere containing H$_2$ (hydrogen) after the formation of the conductive film 12 are compared with regard to the main materials used as the oxygen deficiency adjustment layer 6, the relation Al$_2$O$_3$>HfO$_2$>Y$_2$O$_3$ is established. When the p-channel MISFET formed on the main surface of the substrate 1 made of single crystal silicon forms the complementary MISFET, the effective work function is, for example, approximately 4.95 eV to 5.15 eV, and it is found from FIG. 8 that it is preferable to use Al$_2$O$_3$ or HfO$_2$ as the oxygen deficiency adjustment layer 6. More specifically, when the high dielectric constant film 8 like an HfO$_2$ film is used as a gate insulating film, by appropriately selecting the material of the oxygen deficiency adjustment layer 6 and the temperature of the heat treatment in the atmosphere containing H$_2$ (hydrogen) after the formation of the conductive film 12, the flat band voltage (threshold voltage) of the p-channel MISFET can be precisely controlled in a wide range, and a desired flat band voltage (threshold voltage) of the p-channel MISFET can be obtained.

Figure 13:
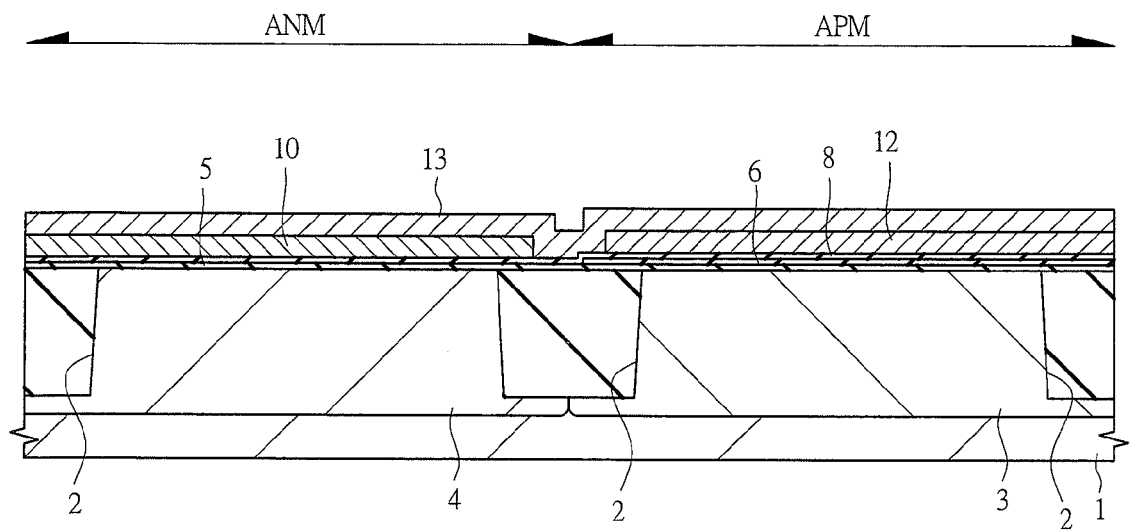
FIG. 13 is a cross sectional view showing the principal part of the manufacturing process of the semiconductor device continued from FIG. 6.

Next, as shown in FIG. 13, after depositing an amorphous silicon film on the substrate 1, the amorphous silicon film is heat treated, thereby forming a polycrystalline silicon film 13. Herein, the polycrystalline silicon film may be deposited by, for example, the CVD method while omitting the deposition of the amorphous silicon film. The above-described heat treatment in the atmosphere containing H$_2$ (hydrogen) after the formation of the conductive film 12 may be carried out immediately after the formation of this polycrystalline silicon film 13.

Figure 14:
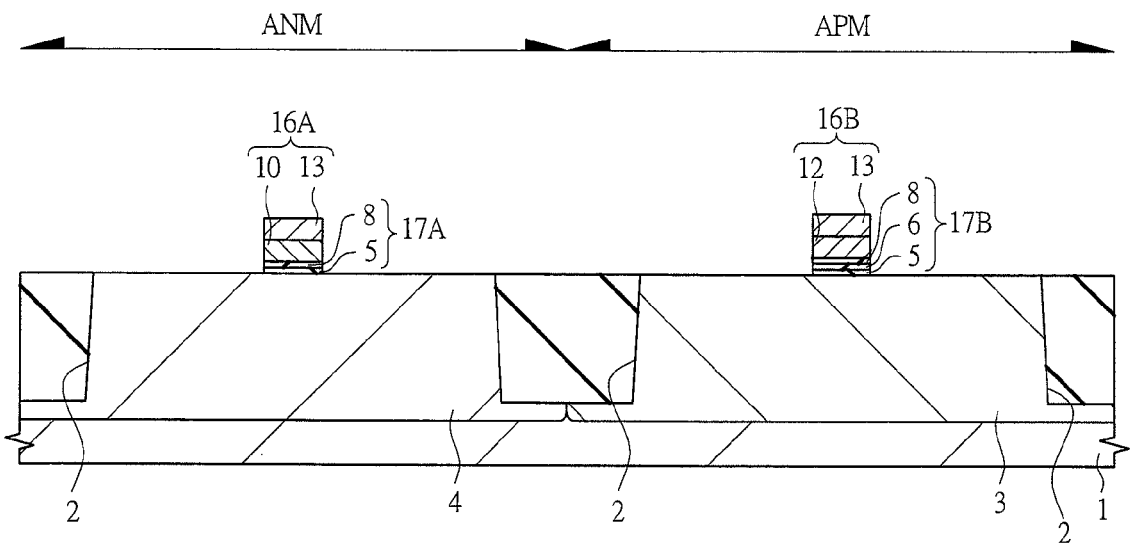
FIG. 14 is a cross sectional view showing the principal part of the manufacturing process of the semiconductor device continued from FIG. 13.

Next, as shown in FIG. 14, the polycrystalline silicon film 13, the conductive film 12, the tantalum nitride film 10, the high dielectric constant film 8, the oxygen deficiency adjustment layer 6, and the silicon oxide film 5 are etched with using a photoresist film (not illustrated) patterned by the photolithography technique as a mask. By this means, a gate electrode 16A formed of the tantalum nitride film 10 and the polycrystalline silicon film 13 and a gate insulating film (second gate insulating film) 17A formed of the silicon oxide film 5 and the high dielectric constant film 8 are formed in the region ANM, and a gate electrode 16B formed of the conductive film 12 and the polycrystalline silicon film 13 and a gate insulating film (first gate insulating film) 17B formed of the silicon oxide film 5, the oxygen deficiency adjustment layer 6, and the high dielectric constant film 8 are formed in the region APM.

Figure 15:
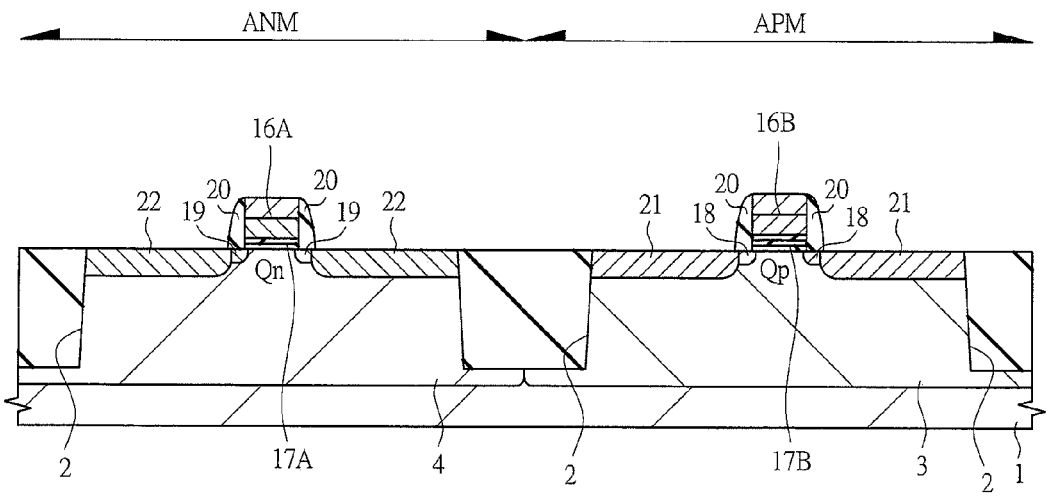
FIG. 15 is a cross sectional view showing the principal part of the manufacturing process of the semiconductor device continued from FIG. 14.

Next, as shown in FIG. 15, for example, B is ion implanted into the n-type well 3 as a p-type impurity, thereby forming comparatively low-concentration p$^-$ type semiconductor regions 18, and P or As is ion implanted into the p-type well 4 as an n-type impurity, thereby forming comparatively low-concentration n$^-$ type semiconductor regions 19. The p$^-$ type semiconductor regions 18 and the n$^-$ type semiconductor regions 19 are formed in order to make the LDD (Lightly Doped Drain) structure for the source and drain of the p-channel MISFET and the n-channel MISFET.

Then, sidewall spacers 20 formed of an insulating film are formed on the sidewalls of the gate electrodes 16A and 16B. The sidewall spacers 20 are formed by depositing a silicon oxide film on the substrate 1 by, for example, the CVD method and then anisotropically etching this silicon oxide film.

Next, B is ion implanted into the n-type well 3 as a p-type impurity, thereby forming comparatively high-concentration $p^+$ type semiconductor regions 21, and P or As is ion implanted into the p-type well 4 as an n-type impurity, thereby forming comparatively high-concentration $n^+$ type semiconductor regions 22. The $p^+$ type semiconductor regions 21 and the $n^+$ type semiconductor regions 22 constitute the source and drain of the p-channel MISFET and the n-channel MISFET, respectively. Through the processes so far, a p-channel MISFET Qp and an n-channel type MISFET Qn can be formed. The heat treatment process at approximately 1000° C. or more for activating the introduced impurities may be performed respectively at the fabrication process of the $p^-$ type semiconductor regions 18 and the $n^-$ type semiconductor regions 19 and the fabrication process of the $p^+$ type semiconductor regions 21 and the $n^+$ type semiconductor regions 22 or collectively at the end of the processes as long as these semiconductor regions can be formed.

Figure 16:
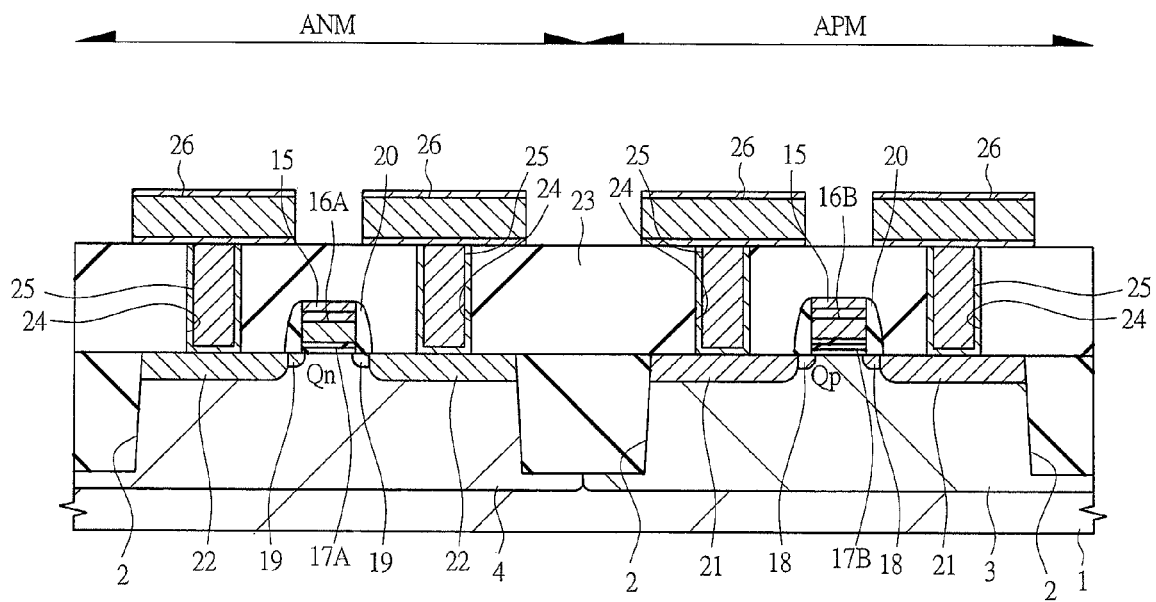
FIG. 16 is a cross sectional view showing the principal part of the manufacturing process of the semiconductor device continued from FIG. 15.

Next, as shown in FIG. 16, after depositing an embedding silicon oxide film on the entire surface of the above-described transistor element structure by, for example, the CVD method, the film is planarized by the CMP technique so as to expose the upper surface of the polycrystalline silicon film 13. The heat treatment in the atmosphere containing $H_2$ (hydrogen) may be performed at this stage.

Then, on the polycrystalline silicon film 13, for example, an Ni (nickel) film is deposited to form a metal film. As this metal film, a Ti (titanium) film, a W (tungsten) film, a Ta (tantalum) film, a nickel (Ni) film, a Pt (platinum) film, or a Ru (ruthenium) film may be employed besides the Ni film. Subsequently, the substrate 1 is heat treated at approximately 400° C. for around 10 minutes to react the metal film with the polycrystalline silicon film 13, thereby forming a metal silicide film (compound film) 15. Then, the unreacted metal film is removed by wet etching or the like.

The p-channel MISFET Qp and the n-channel MISFET Qn of the first embodiment formed as mentioned above include the high dielectric constant film 8, the dielectric constant of which is higher than that of the silicon oxide film, in the gate insulating films 17A and 17B, and therefore, it is possible to keep the electrostatic capacitance of the gate insulating films 17A and 17B without reducing the film thickness in comparison with the case where an silicon oxide film is used. Accordingly, since it is possible to restrain the occurrence of the tunnel current in the gate insulating films 17A and 17B, it becomes possible to save the power consumption of the p-channel MISFET Qp and the n-channel MISFET Qn.

Next, as an insulating film to cover the p-channel MISFET Qp and the n-channel MISFET Qn, a silicon oxide film 23 is deposited by, for example, the CVD method, and the surface of the silicon oxide film 23 is planarized by the chemical mechanical polishing method.

Next, the silicon oxide film 23 is dry etched with using the photoresist film as a mask, thereby forming contact holes 24 on the sources and drains of the p-channel MISFET Qp and the n-channel MISFET Qn (the $p^+$ type semiconductor regions 21 and the $n^+$ type semiconductor regions 22). Then, plugs 25 are formed in the contact holes 24. The plugs 25 are formed by, for example, depositing a Ti film and a TiN (titanium nitride) film by the sputtering method on the silicon oxide film 23 including the inside of the contact holes 24, depositing a TiN film and a W film as a metal film by the CVD method, and then removing the W film, the TiN film, and the Ti film outside the contact holes 24 by the chemical mechanical polishing method.

Subsequently, by forming wirings 26 on the silicon oxide film 23 and the plugs 25, the semiconductor device of the first embodiment is manufactured. The wirings 26 are formed by, for example, sequentially depositing a Ti film, an Al (aluminum) alloy film, and a TiN film on the silicon oxide film 23 by the sputtering method, and then patterning the Ti film, the Al alloy film and the TiN film by the dry etching using the photoresist film as a mask.

Note that wirings may be formed in multiple layers by repeating the process of forming the plugs 25 and the wirings 26.

Second Embodiment

A semiconductor device according to a second embodiment also has a complementary MISFET similarly to the semiconductor device according to the first embodiment. Hereinafter, the semiconductor device according to the second embodiment and a manufacturing method of the same will be described with reference to FIG. 17 to FIG. 21.

Figure 17:
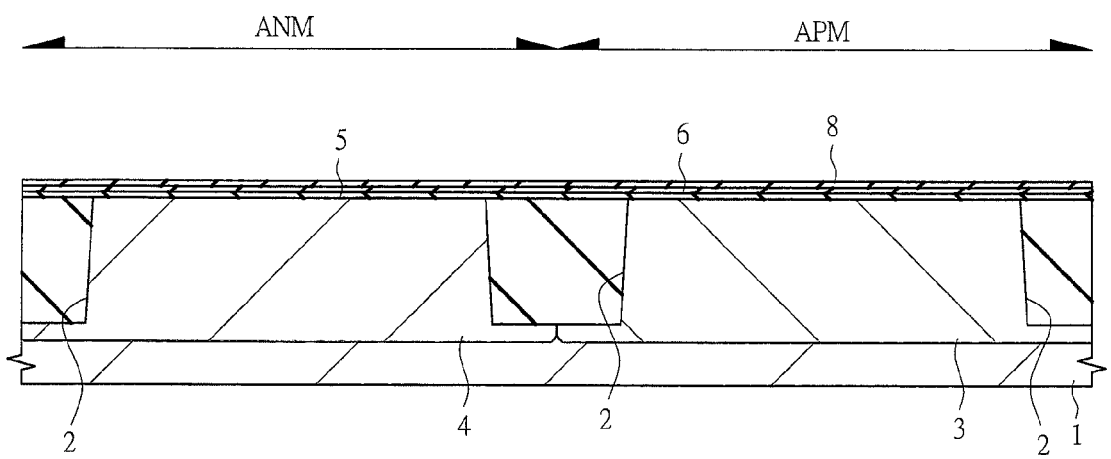
FIG. 17 is a cross sectional view showing the principal part for describing a manufacturing method of a semiconductor device according to a second embodiment of the present invention.

The manufacturing processes of the semiconductor device of the second embodiment are the same as those of the first embodiment up to the process of forming the oxygen deficiency adjustment layer 6 described in the first embodiment (refer to FIG. 2). Thereafter, as shown in FIG. 17, a high dielectric constant film 8 that is the same as the high dielectric constant film 8 described in the first embodiment (also refer to FIG. 3) is formed on the main surface of the substrate 1.

Figure 18:
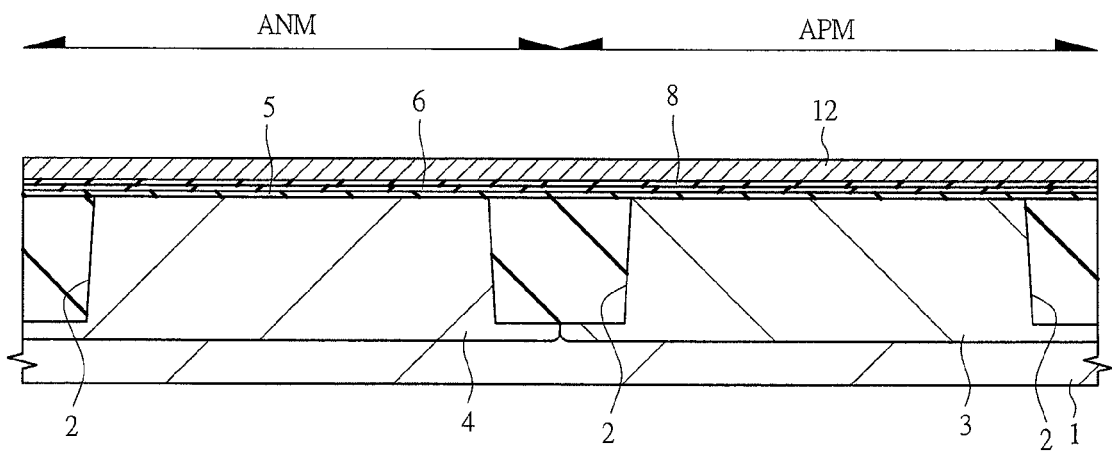
FIG. 18 is a cross sectional view showing the principal part of the manufacturing process of the semiconductor device continued from FIG. 17.

Next, as shown in FIG. 18, a conductive film 12 that is the same as the conductive film 12 having the reduction catalyst effect to hydrogen described in the first embodiment (also refer to FIG. 5) is formed on the main surface of the substrate 1.

Figure 19:
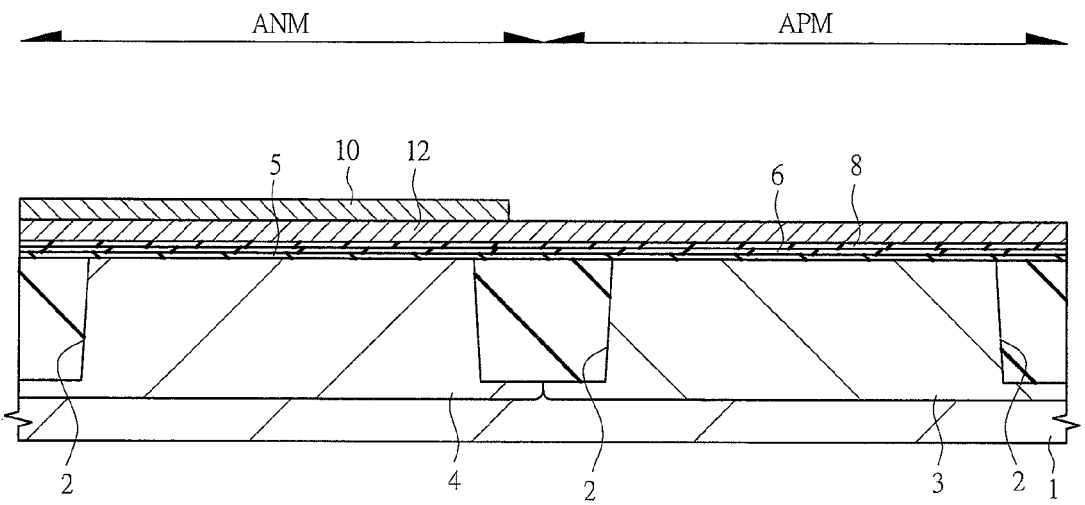
FIG. 19 is a cross sectional view showing the principal part of the manufacturing process of the semiconductor device continued from FIG. 18.

Subsequently, as shown in FIG. 19, after covering the regions other than the region ANM with a photoresist film (not illustrated) patterned by the photolithography technique, a tantalum nitride film 10 with the film thickness of approximately 20 nm is deposited on the conductive film 12. Then, the tantalum nitride film 10 of the regions other than the region ANM is removed by the lift-off method. In other words, by removing the above-mentioned photoresist film, the tantalum nitride film 10 of the regions other than the region ANM is removed.

Then, the substrate 1 is heat treated at approximately 450° C. in the atmosphere containing approximately 3% of $H_2$ (hydrogen). By this means, based on the same principle as that in the case of the p-channel MISFET Qp described in the first embodiment, it is possible to control the effective work function also in the n-channel MISFET Qn formed in the region ANM. More specifically, the conductive film 12 has the reduction catalyst effect to hydrogen, and O (oxygen) that composes the high dielectric constant film 8 is reduced to generate $H_2O$ (water) by the heat treatment in the atmosphere containing approximately 3% of $H_2$. Although the high dielectric constant film 8 has a composition in which O is deficient by the reduction, O is taken in from the underlying oxygen deficiency adjustment layer 6, thereby compensating the deficiency of O. Therefore, the oxygen deficiency adjustment layer 6 has a composition in which O is deficient, and a dipole ($2e^-$, $Vo^{2+}$) is formed between the oxygen deficiency adjustment layer 6 and the silicon oxide film 5. As a result, as described with reference to FIG. 8 to FIG. 12 in the first embodiment, it is possible to control the effective work function of the MISFET, and in the case of the n-channel MISFET Qn, it is possible to reduce the effective work function and also reduce the flat band voltage (threshold voltage). In other words, it is possible to obtain a desired flat band voltage (threshold voltage) of the n-channel MISFET Qn.

Figure 20:
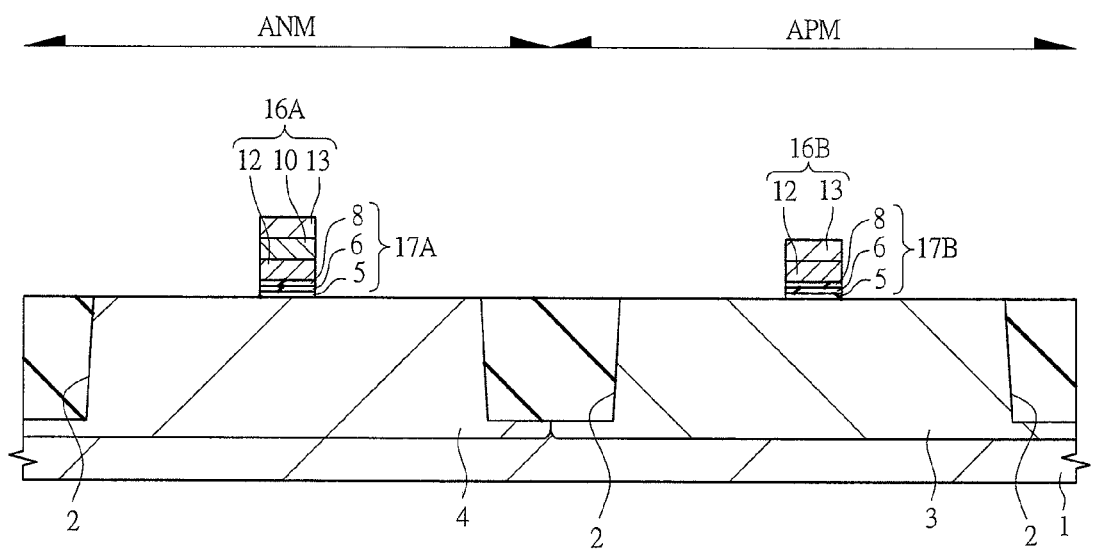
FIG. 20 is a cross sectional view showing the principal part of the manufacturing process of the semiconductor device continued from FIG. 19.

Next, as shown in FIG. 20, after forming the polycrystalline silicon film 13 through the same process as that described with reference to FIG. 13 and FIG. 14 in the first embodiment, the polycrystalline silicon film 13, the conductive film 12, the tantalum nitride film 10, the high dielectric constant film 8, the oxygen deficiency adjustment layer 6, and the silicon oxide film 5 are etched with using the photoresist film (not illustrated) patterned by the photolithography technique as a mask. By this means, a gate electrode (first gate electrode) 16A formed of the tantalum nitride film 10, the polycrystalline silicon film 13, and the conductive film 12 and a gate insulating film (first gate insulating film) 17A formed of the silicon oxide film 5, the oxygen deficiency adjustment layer 6, and the high dielectric constant film 8 are formed in the region ANM, and a gate electrode (second gate electrode) 16B formed of the conductive film 12 and the polycrystalline silicon film 13 and a gate insulating film (second gate insulating film) 17B formed of the silicon oxide film 5, the oxygen deficiency adjustment layer 6, and the high dielectric constant film 8 are formed in the region APM. By forming the respective gate electrodes 16A and 16B and the gate insulating films 17A and 17B of the p-channel MISFET Qp and the n-channel MISFET Qn through such processes, the materials of the gate electrode and the gate insulating film can be shared by the p-channel MISFET Qp and the n-channel MISFET Qn (except for the tantalum nitride film 10). Accordingly, it becomes possible to control the threshold voltage of the complementary MISFET in a wide range and precisely, while preventing the increase in the number of manufacturing processes.

Figure 21:
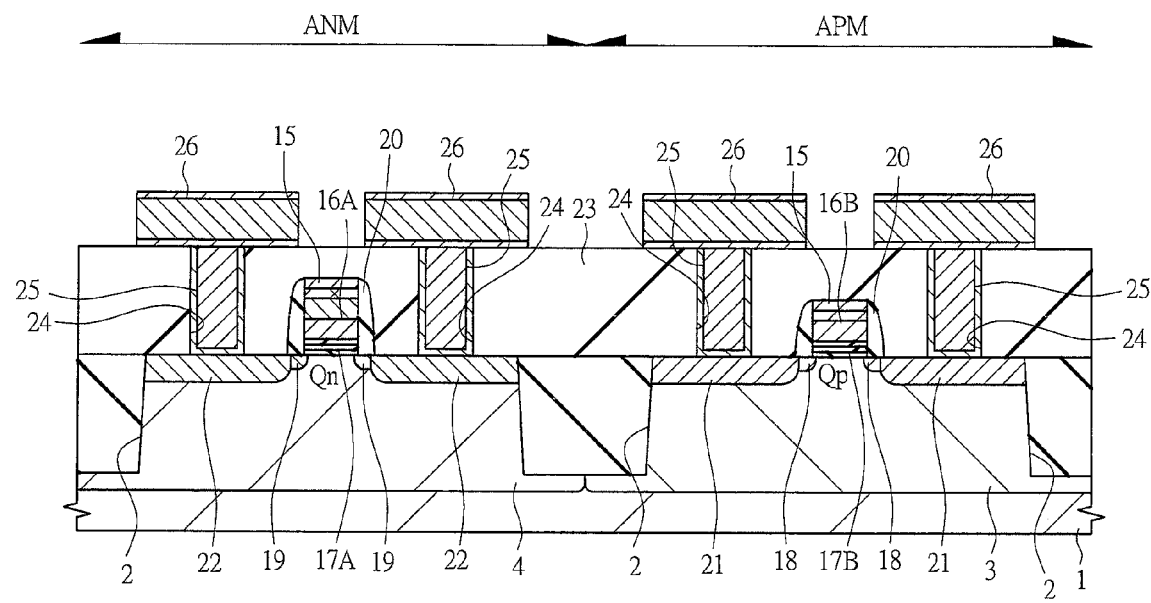
FIG. 21 is a cross sectional view showing the principal part of the manufacturing process of the semiconductor device continued from FIG. 20.

Thereafter, through the same process as that described with reference to FIG. 15 and FIG. 16 in the first embodiment, the semiconductor device according to the second embodiment is manufactured (refer to FIG. 21).

Third Embodiment

A semiconductor device according to a third embodiment has a complementary MISFET formed by use of an SOI (Silicon On Insulator) substrate. Hereinafter, the semiconductor device according to the third embodiment and a manufacturing method of the same will be described with reference to FIG. 22 to FIG. 24.

Figure 22:
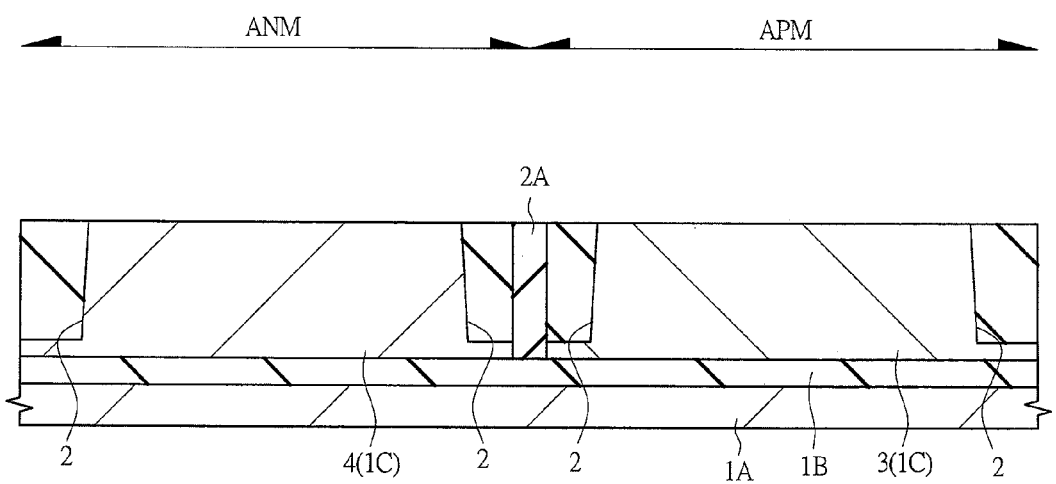
FIG. 22 is a cross sectional view showing the principal part for describing a manufacturing method of a semiconductor device according to a third embodiment of the present invention.

As shown in FIG. 22, the SOI substrate used in the third embodiment is formed by bonding a base substrate 1A made of, for example, single crystal silicon and a bond substrate made of single crystal silicon and having a silicon oxide film formed on its surface, and the silicon oxide film on the surface of the bond substrate serves as a BOX (Buried Oxide) layer 1B and the single crystal silicon part of the bond substrate serves as an SOI layer 1C.

After forming element isolation trenches 2 in the SOI layer 1C of the SOI substrate through the same process as that described with reference to FIG. 1 in the first embodiment, for example, U trenches that reach the BOX layer 1B are formed in the main surface of the SOI substrate and an silicon oxide film is embedded in the trenches, thereby forming U-trench element isolation regions 2A. Thereafter, an n-type well 3 is formed in the SOI layer 1C of the region APM, and a p-type well 4 is formed in the SOI layer 1C of the region ANM. The process to form these n-type well 3 and p-type well 4 is same as that in the first embodiment (refer to FIG. 1).

Figure 23:
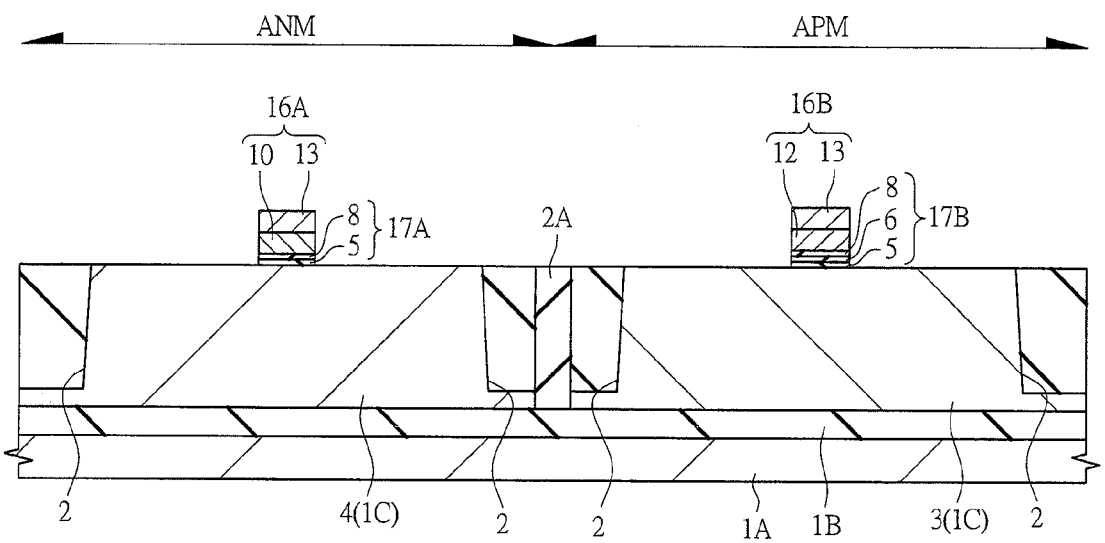
FIG. 23 is a cross sectional view showing the principal part of the manufacturing process of the semiconductor device according to the third embodiment of the present invention.
Figure 24:
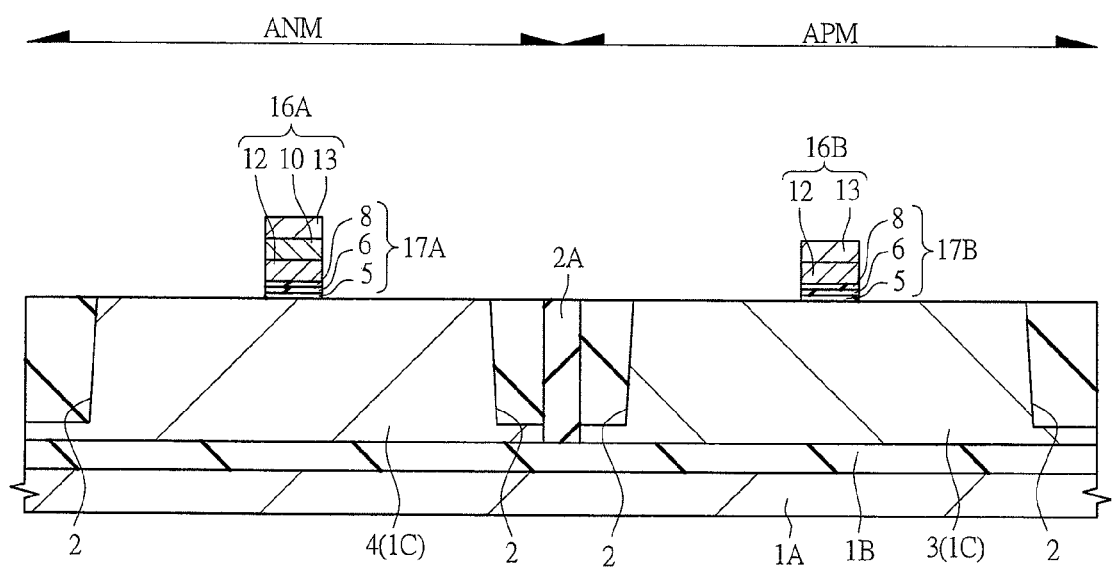
FIG. 24 is a cross sectional view showing the principal part of the manufacturing process of the semiconductor device according to the third embodiment of the present invention.

A cross section showing the principal part at the time when the gate electrodes 16A and 16B and the gate insulating films 17A and 17B are formed thereafter through the same process as that described in the first embodiment (refer to FIGS. 1 to 6, FIG. 13, and FIG. 14) is shown in FIG. 23, and a cross section showing the principal part at the time when the gate electrodes 16A and 16B and the gate insulating films 17A and 17B are formed through the same process as that described in the second embodiment (refer to FIGS. 17 to 20) is shown in FIG. 24.

In the complementary MISFET formed by use of the SOI substrate, the effective work function is, for example, approximately 4.4 eV to 4.8 eV. Therefore, in the case where the flat band voltage (threshold voltage) of the p-channel MISFET is to be controlled, it is preferable that the structure shown in FIG. 23 is employed, $Al_2O_3$ or $HfO_2$ is used as the oxygen deficiency adjustment layer 6, and the temperature of the heat treatment in the atmosphere containing $H_2$ (hydrogen) after the formation of the conductive film 12 is set to approximately 500° C. to 600° C. from the graph shown in FIG. 8 in the first embodiment. On the other hand, in the case where the flat band voltage (threshold voltage) of the n-channel MISFET is to be controlled, it is preferable that the structure shown in FIG. 24 is employed, $Y_2O_3$ is used as the oxygen deficiency adjustment layer 6, and the temperature of the heat treatment in the atmosphere containing $H_2$ (hydrogen) after the formation of the conductive film 12 is set to approximately 400° C. to 600° C. from the graph shown in FIG. 8 in the first embodiment.

After forming the gate electrodes 16A and 16B and the gate insulating films 17A and 17B, through the same processes as those described with reference to FIG. 15 and FIG. 16 in the first embodiment, the semiconductor device according to the third embodiment can be manufactured.

In the foregoing, the invention made by the inventors of the present invention has been concretely described based on the embodiments. However, it is needless to say that the present invention is not limited to the foregoing embodiments and various modifications and alterations can be made within the scope of the present invention.

The semiconductor device and the manufacturing method of the same according to the present invention can be widely applied to the semiconductor device provided with a complementary MISFET and the manufacturing processes thereof.

What is claimed is:
1. A semiconductor device comprising:
a MISFET including:
   a gate insulating film formed on a semiconductor substrate;
   a gate electrode formed on the gate insulating film;
   a source region formed in the semiconductor substrate; and
   a drain region formed in the semiconductor substrate,
wherein the gate insulating film includes:
   a silicon oxide layer formed on the semiconductor substrate;
   an oxygen deficiency adjustment layer formed on the silicon oxide layer; and
   a high dielectric constant layer formed on the oxygen deficiency adjustment layer, the high dielectric constant layer including a hafnium oxide film,
wherein the gate electrode includes a metal film formed on the high dielectric constant layer and having a reduction catalyst effect,
wherein the oxygen deficiency adjustment layer comprises an oxide containing a group 2A element, a group 3A element, a group 3B element, a group 4A element, or a group 5A element, and wherein the gate insulating film is formed such that a dipole exists between the silicon oxide layer and the oxygen deficiency adjustment layer.

2. The semiconductor device according to claim 1, wherein the metal film is a single layer film of platinum or rhenium, a laminated film with a platinum layer and a rhenium layer, or an alloy film formed from platinum or rhenium.

3. The semiconductor device according to claim 1, wherein the MISFET is a p-channel MISFET.

4. The semiconductor device according to claim 1, wherein the MISFET is an n-channel MISFET.

5. The semiconductor device according to claim 1, wherein the oxygen deficiency adjustment layer comprises $Al_2O_3$, $Y_2O_3$, $La_2O_3$, MgO, CaO, SrO, or BaO.

6. The semiconductor device according to claim 1, wherein the high dielectric constant layer is in contact with the oxygen deficiency adjustment layer and the gate electrode.

7. The semiconductor device according to claim 1, wherein the MISFET has been heat treated such that the oxygen deficiency adjustment layer has a lower oxygen content than prior to the heat treatment, said lower oxygen content contributing to the dipole between the silicon oxide layer and the oxygen deficiency adjustment layer.

8. The semiconductor device according to claim 1, wherein
the oxygen deficiency adjustment layer has a pre-heat-treatment first state and a post-heat-treatment second state,
the oxygen deficiency adjustment layer has a higher oxygen content in the first state than in the second state, and
the dipole formed between the silicon oxide layer and the oxygen deficiency adjustment layer in the second state has at least one different property than the dipole formed between the silicon oxide layer and the oxygen deficiency adjustment layer in the first state.

* * * * *